US011121132B2

(12) United States Patent
Yang (10) Patent No.: US 11,121,132 B2
(45) Date of Patent: Sep. 14, 2021

(54) GATE-CUT ISOLATION STRUCTURE AND FABRICATION METHOD

(71) Applicant: QUALCOMM Incorporated, San Diego, CA (US)

(72) Inventor: Haining Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 27 days.

(21) Appl. No.: 16/678,320

(22) Filed: Nov. 8, 2019

(65) Prior Publication Data
US 2021/0143152 A1    May 13, 2021

(51) Int. Cl.
| | |
|---|---|
| *H01L 21/76* | (2006.01) |
| *H01L 21/70* | (2006.01) |
| *H01L 27/092* | (2006.01) |
| *H01L 21/8238* | (2006.01) |
| *H01L 29/78* | (2006.01) |
| *H01L 29/66* | (2006.01) |
| *H01L 21/762* | (2006.01) |

(52) U.S. Cl.
CPC .... *H01L 27/0924* (2013.01); *H01L 21/76224* (2013.01); *H01L 21/823821* (2013.01); *H01L 21/823878* (2013.01); *H01L 29/66545* (2013.01); *H01L 29/66795* (2013.01); *H01L 29/785* (2013.01)

(58) Field of Classification Search
CPC ..... H01L 21/823878; H01L 21/823821; H01L 29/66795
USPC .......... 257/523–527; 438/404, 424
See application file for complete search history.

(56) References Cited

U.S. PATENT DOCUMENTS

| | | | | |
|---|---|---|---|---|
| 10,269,803 | B2 * | 4/2019 | Ching | H01L 27/0924 |
| 10,515,959 | B2 * | 12/2019 | Chang | H01L 21/30608 |
| 10,811,422 | B2 * | 10/2020 | Shen | H01L 21/823431 |
| 10,825,738 | B2 * | 11/2020 | Zhu | H01L 21/26533 |

* cited by examiner

*Primary Examiner* — Calvin Lee
(74) *Attorney, Agent, or Firm* — QUALCOMM Incorporated (57) ABSTRACT

Certain aspects of the present disclosure generally relate to a semiconductor device with a gate-cut isolation structure. An example method of fabricating semiconductor device generally includes forming a dielectric region between a first semiconductor region and a second semiconductor region. The method also includes forming a first gate region disposed above and spanning a width of the dielectric region between the first and second semiconductor regions, wherein the first gate region is also disposed above at least a portion of the first semiconductor region and above at least a portion of the second semiconductor region. The method further includes concurrently forming an SDB and a gate-cut isolation structure, wherein the SDB intersects the first and second semiconductor regions and wherein the gate-cut isolation structure electrically separates the first gate region into a first portion associated with the first semiconductor region and a second portion associated with the second semiconductor region.

19 Claims, 7 Drawing Sheets

GATE-CUT ISOLATION STRUCTURE AND FABRICATION METHOD

BACKGROUND

Field of the Disclosure

Certain aspects of the present disclosure generally relate to integrated circuits and, more particularly, to a gate-cut isolation structure of a semiconductor device and techniques for fabricating such a structure.

Description of Related Art

As electronic devices are getting smaller and faster, the demand for integrated circuits (ICs) with higher I/O count, faster data processing rate, and better signal integrity greatly increases. The ICs may include various transistors forming memory circuits, logic circuits, amplifiers, comparators, etc. A transistor is a semiconductor device used to amplify or switch electronic signals and/or electrical power. There are several types of transistors, one of the most common types being a metal-oxide-semiconductor field-effect transistor (MOSFET). A MOSFET may be implemented as a p-type transistor, referred to as a p-type metal-oxide-semiconductor (PMOS) transistor, or an n-type transistor, referred to as an n-type metal-oxide-semiconductor (NMOS) transistor, both of which have a similar structure, but are implemented with semiconductor regions having opposite doping types. The transistors of an IC may be separated by insulated regions called diffusion breaks, such as a double diffusion break (DDB) or a single diffusion break (SDB). A double diffusion break may occupy two dummy gate spaces, whereas a single diffusion break may occupy a single dummy gate space.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include an improved gate-cut isolation structure for electrically separating gate regions from each other.

Certain aspects of the present disclosure provide a method of fabricating a semiconductor device. The method generally includes forming a dielectric region between a first semiconductor region and a second semiconductor region. The method also includes forming a first gate region disposed above and spanning a width of the dielectric region between the first and second semiconductor regions, wherein the first gate region is also disposed above at least a portion of the first semiconductor region and above at least a portion of the second semiconductor region. The method further includes concurrently forming a single diffusion break (SDB) and a gate-cut isolation structure, wherein the SDB intersects the first and second semiconductor regions and wherein the gate-cut isolation structure electrically separates the first gate region into a first portion associated with the first semiconductor region and a second portion associated with the second semiconductor region.

Certain aspects of the present disclosure provide a semiconductor device. The semiconductor device generally includes a first semiconductor region, a second semiconductor region, a dielectric region, a first gate region, a second gate region, a single diffusion break (SDB), and a gate-cut isolation structure. The dielectric region is disposed between the first semiconductor region and the second semiconductor region. The first gate region is disposed above a portion of the first semiconductor region. The second gate region disposed above a portion of the second semiconductor region. The SDB, comprising an insulation material, intersects at least one of the first semiconductor region or the second semiconductor region and is laterally spaced from the first and second gate regions. The gate-cut isolation structure comprises the same insulation material as the SDB and is disposed between and electrically separates the first gate region and the second gate region.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure relate to a semiconductor device with a gate-cut isolation structure formed with the same insulation material as a single diffusion break. As further described herein, with the same insulation material, the gate-cut isolation structure may mitigate and/or eliminate stress effects that cause variations/shifts in the threshold voltage of active electrical devices (e.g., a transistor).

Example Gate-Cut Isolation Structure

In the micro-electronic technology industry, there is a continuous demand and evolution of processes, technologies, and assembly methodologies to design and implement smaller, more efficient integrated circuits (ICs). Current complementary metal-oxide-semiconductor (CMOS) fabrication processes may pattern a gate of a transistor with a continuous line due to narrow gate dimension (e.g., ≤15 nm wide) and expectations of gate uniformity. A gate-cut process may then be used to separate the gate strip into individual gates. However, the current gate-cut processes can produce defects (e.g., dummy polysilicon is not removed and/or metal gate is not filled), which may cause significant shifts in the threshold voltage $V_t$ of the semiconductor device.

Typically, the gate cut is performed after forming a dummy polysilicon gate over a fin. The narrow gate extension of the dummy polysilicon may be difficult to remove and fill in with a high-κ material, which may result in an asymmetric gate structure formed over the fin and lead to a shift in the threshold voltage Vt. In other cases, work function metals may also be difficult to remove during gate fabrication such that work function metal residues are left behind outside the desired gate region, which may lead to a shift in the threshold voltage Vt. In certain cases, the gate-cut process can generate strong stress effects, such as a substantial current shift and/or voltage shift (e.g., 8-20%) for short channel N/PMOS devices. Alternatively, a later gate cut process may be performed, but involves a complex and costly process flow.

Certain aspects of the present disclosure relate to a gate-cut isolation structure that is formed with essentially the same insulation material as an SDB, which in some cases improves mitigation of the stress effects and decreases $V_t$ shift previously described. In certain aspects, the gate-cut isolation structure may be formed concurrently with an SDB, such as filling the trenches of the gate-cut isolation structure and the SDB with the same insulation material. As used herein, "concurrently" generally refers to being performed during the same fabrication stage and can include two steps being performed simultaneously or sequentially. An SDB isolates the active electrical devices in the source/drain direction. The SDB fabrication process etches through the gate stack including high-κ dielectrics and metal gate materials along the gate direction. It is advantageous to combine the gate cut and SDB process at the same process stage as further described herein. In aspects, the fabrication process for the gate-cut isolation structure described herein provides a simpler process that reduces defects, process time, and cost. Stress effects from the gate cut may be significantly reduced. In some cases with the gate-cut isolation structure as described herein, the stress effects have been reduced close to zero due to the late process after the gate and interlayer dielectric formation and the superior insulation material of the SDB.

Figure 1A:
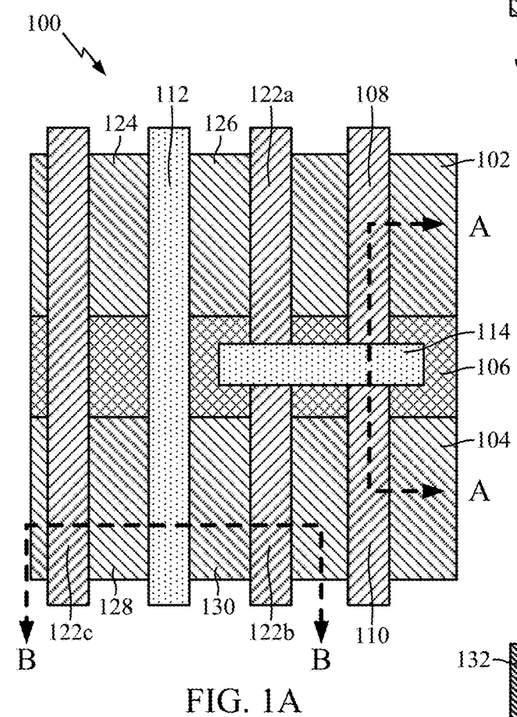
FIG. 1A illustrates a top view of an example semiconductor device with a single diffusion break (SDB) and a gate-cut isolation structure, in accordance with certain aspects of the present disclosure.
Figure 1B:
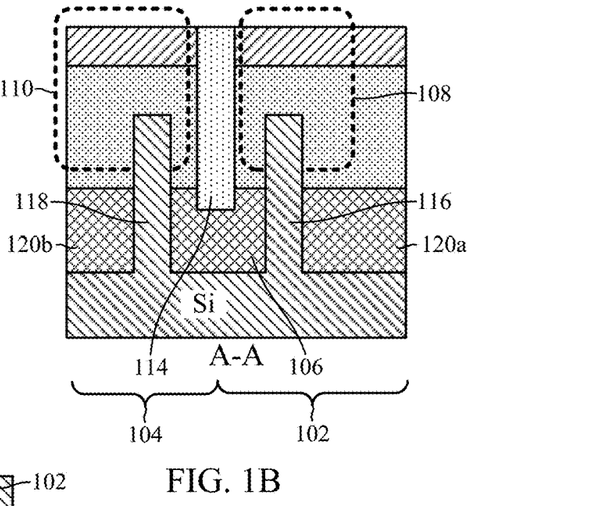
FIG. 1B illustrates a cross-sectional view of the example semiconductor device of FIG. 1A, in accordance with certain aspects of the present disclosure.
Figure 1C:
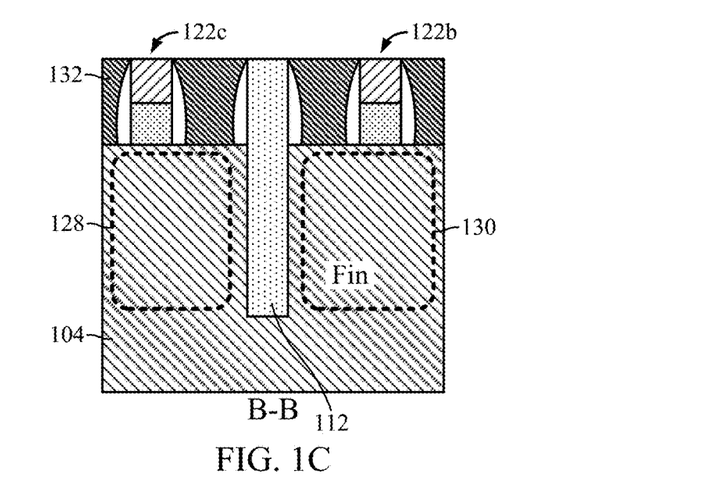
FIG. 1C illustrates another cross-sectional view of the example semiconductor device of FIG. 1A, in accordance with certain aspects of the present disclosure.

FIG. 1A illustrates a top view of an example semiconductor device 100 having an SDB and a gate-cut isolation structure, in accordance with certain aspects of the present disclosure. FIGS. 1B and 1C illustrate cross-sectional views of the example semiconductor device 100 along the cross-sections taken across lines A-A and B-B, respectively, as depicted in FIG. 1A.

Referring to FIG. 1A, the semiconductor device 100 may be any suitable integrated circuit having transistors that may perform, for example, switching or signal amplification operations. The semiconductor device 100 may be included in an integrated circuit (IC) die fabricated, for example, in a wafer-level package and/or a chip-scale package. As an example, the semiconductor device 100 may be a processor (e.g., a central processor, a graphics processor, or a digital signal processor (DSP)), an application specific integrated circuit (ASIC), a field programmable gate array (FPGA) or other programmable logic device (PLD), discrete gate or transistor logic, discrete hardware components, or any combination thereof and/or a memory device. In other cases, the semiconductor device 100 may be a power management integrated circuit (PMIC) that performs, for example, voltage regulation, power source selection, battery charging management, etc. As shown, the semiconductor device 100 may include a first semiconductor region 102, a second semiconductor region 104, a dielectric region 106, a first gate region 108, a second gate region 110, an SDB 112, and a gate-cut isolation structure 114.

In aspects, the semiconductor device 100 may include fin field-effect transistors (finFETs), which, for example, are in part formed from the first and/or second semiconductor regions 102, 104 and the first and/or second gate regions 108, 110. Referring to FIG. 1B, a portion of the first semiconductor region 102 may include a first semiconductor fin 116 (e.g., a fin structure that extends above a base portion of the semiconductor region), and a portion of the second semiconductor region 104 may include a second semiconductor fin 118. In certain aspects, each of the first and second semiconductor regions 102, 104 may include multiple semiconductor fin structures. Referring to FIG. 1C, a portion of a fin structure of the second semiconductor region 104 may be laterally spaced from the second semiconductor fin 118.

The first gate region 108 is disposed above a portion of the first semiconductor region 102, and the second gate region 110 is disposed above a portion of the second semiconductor region 104. That is, the first gate region 108 is disposed above and around an upper portion of the first semiconductor fin 116, and the second gate region 110 is disposed above and around an upper portion of the second semiconductor fin 118. In aspects, the semiconductor device 100 may include additional gate regions 122a, 122b, 122c (collectively "additional gate regions 122") that intersect other portions of the first and/or second semiconductor regions 102, 104. Some of the additional gate regions 122a, 122b may be disposed between the SDB 112 and the first and second gate regions 108, 110.

In aspects, a gate region may include, for example, a dielectric layer (e.g., silicon dioxide) and a non-insulative region (e.g., a polysilicon gate) disposed above the dielectric layer. A "non-insulative region" generally refers to a region that may be electrically conductive or semiconductive. In certain aspects, a gate region may include various layers of work function metals and gate conductors (e.g., after replacing the dummy polysilicon gates with metal gates).

In certain aspects, the first semiconductor region 102 may be a p-type metal-oxide-semiconductor (PMOS) region. For example, the first semiconductor region 102 may include a p+ doped semiconductor (e.g., p+ doped silicon), such as an implant region for a source and/or drain of a PMOS transistor. The second semiconductor region 104 may be an n-type metal-oxide-semiconductor (NMOS) region. For example, the second semiconductor region 104 may include an n+ doped semiconductor (e.g., n+ doped silicon), such as an implant region for a source and/or drain of an NMOS transistor. While the examples provided herein are described with respect to the first semiconductor region 102 being a PMOS region and the second semiconductor region 104 being an NMOS region to facilitate understanding, aspects of the present disclosure may also be applied to other suitable semiconductor configurations for the first semiconductor region 102 and the second semiconductor region 104, such as the first semiconductor region 102 being an NMOS region and the second semiconductor region 104 being a PMOS region or the first and second semiconductor regions 102, 104 having the same doping type.

The dielectric region 106 is disposed between the first semiconductor region 102 and the second semiconductor region 104. The dielectric region 106 may include a shallow trench isolation (STI) region that electrically isolates the semiconductor regions 102, 104 from each other. For example, the dielectric region 106 may include a dielectric material such as silicon dioxide. Referring to FIG. 1B, additional dielectric regions 120a, 120b may be disposed between portions of the semiconductor regions 102, 104 and the gate regions 108, 110. For instance, one of the additional dielectric regions 120a may be disposed between a portion of the first semiconductor region 102 and the first gate region 108, and another one of the additional dielectric regions 120b may be disposed between a portion of the second semiconductor region 104 and the second gate region 110. In aspects, the additional dielectric regions 120a, 120b may be adjacent and/or engage the first and second semiconductor fins 116, 118.

Referring to FIGS. 1A and 1C, the SDB 112 intersects at least one of the first semiconductor region 102 or second semiconductor region 104. For instance, in certain cases, the SDB 112 may only intersect the first semiconductor region 102; in other cases, the SDB 112 may only intersect the second semiconductor region 104; and still in other cases, the SDB 112 may intersect both the semiconductor regions 102, 104.

In this example, the SDB 112 includes an insulation material that electrically separates a first portion 124 of the first semiconductor region 102 from a second portion 126 of the first semiconductor region 102 and electrically separates a first portion 128 of the second semiconductor region 104 from a second portion 130 of the second semiconductor region 104. In certain aspects, the insulation material may include silicon dioxide, silicon nitride, or a dielectric material having a low dielectric constant ($\kappa$) relative to silicon dioxide.

In aspects, the SDB 112 may be laterally spaced from the first and second gate regions 108, 110. In certain cases, the SDB 112 may be disposed in parallel with the first and second gate regions 108, 110. Expressed another way, the SDB 112 may be oriented in the same direction as the first and second gate regions 108, 110, having a longitudinal axis that is parallel with the longitudinal axes of the first and second gate regions.

Referring to FIGS. 1A and 1B, the gate-cut isolation structure 114 is disposed between the first gate region 108 and the second gate region 110. The gate-cut isolation structure 114 electrically separates the first gate region 108 from the second gate region 110. In certain aspects, the gate-cut isolation structure 114 may electrically separate other gate regions, such as the additional gate regions 122a, 122b. Expressed another way, the gate-cut isolation structure 114 may extend longitudinally along the dielectric region 106 to electrically separate one or more pairs of gate regions. In this example, the gate-cut isolation structure 114 electrically separates two pairs of gate regions 108, 110, 122a, 122b. In aspects, the gate-cut isolation structure 114 may intersect a portion of the dielectric region 106 and be angled with respect to the SDB 112. For example, the gate-cut isolation structure 114 may be angled perpendicular to the SDB 112 (i.e., the longitudinal axis of the structure 114 is perpendicular to the longitudinal axis of the SDB 112) or may be angled at an oblique angle to the SDB 112.

The gate-cut isolation structure 114 may comprise the same insulation material as the SDB 112. As further described herein, the gate-cut isolation structure 114 and SDB 112 may be concurrently formed together such that the gate-cut isolation structure 114 and SDB 112 may be filled with the same insulation material during the fabrication process of the semiconductor device. Such an insulation material may mitigate the stress effects and defects which cause variations (e.g., shifts) in the threshold voltage of the transistors, for example, as previously described herein with respect to the issues with dummy polysilicon and work function metals.

In aspects, a dielectric material may be disposed between the gate regions and above the semiconductor regions. For instance, referring to FIG. 1C, the dielectric material 132 may be disposed between the additional gate regions 122b, 122c and disposed above the second semiconductor region 104. Although not shown, for certain aspects, the dielectric material 132 may also be disposed between the first and second gate regions 108, 110 and disposed above the first and second semiconductor regions 102, 104.

In certain aspects, the gate-cut isolation structure and the SDB may be formed after a dielectric layer (e.g., an interlayer dielectric) is formed above the gate regions. For example, FIGS. 2A and 2B illustrate cross-sectional views of the example semiconductor device 100 along the cross-sections taken across lines A-A and B-B, respectively, as depicted in FIG. 1A.

Figure 2A:
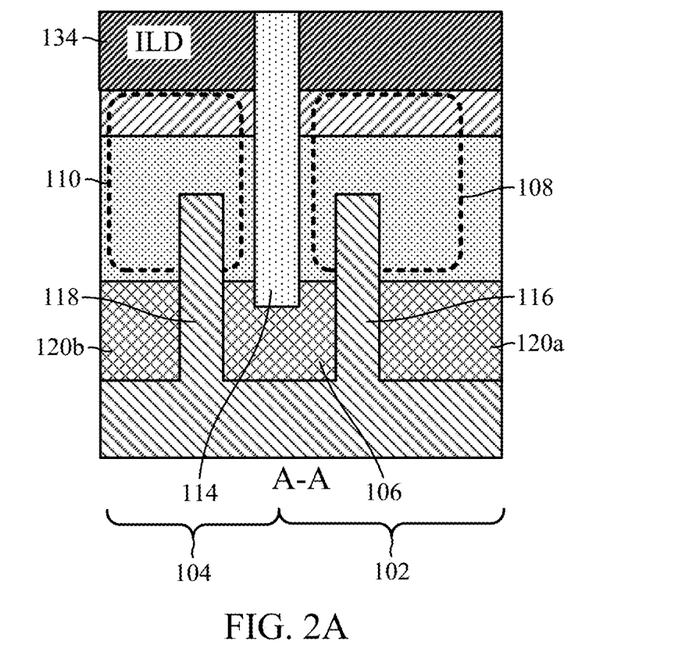
FIG. 2A illustrates a cross-sectional view of the example semiconductor device of FIG. 1A with the gate-cut insolation structure intersecting an interlayer dielectric region, in accordance with certain aspects of the present disclosure.
Figure 2B:
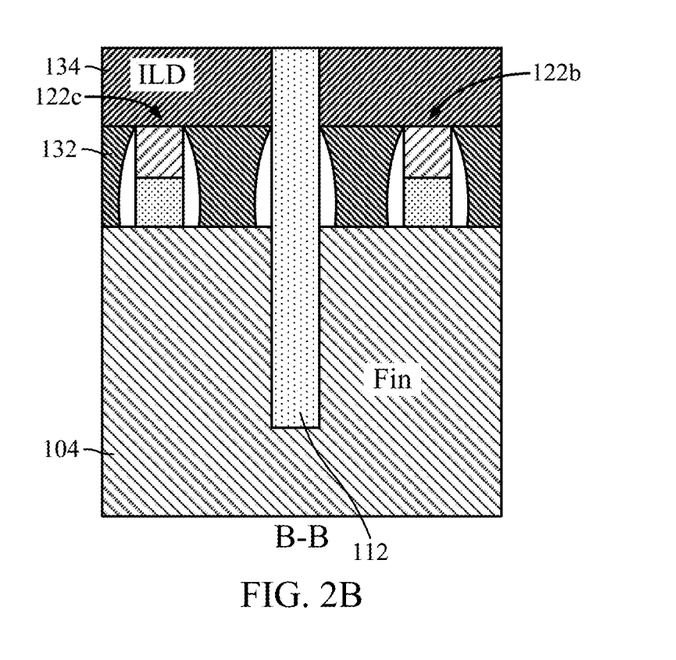
FIG. 2B illustrates a cross-sectional view of the example semiconductor device of FIG. 1A with the SDB intersecting the interlayer dielectric region, in accordance with certain aspects of the present disclosure.

As shown in FIGS. 2A and 2B, an interlayer dielectric (ILD) region 134 may be disposed above the semiconductor regions 102, 104 and the gate regions 108, 110, 122. The ILD region 134 may electrically separate active electrical devices (e.g., transistors) disposed below the ILD region 134 from other electrical components (such as a capacitor, inductor, resistor, etc. (not shown)) or metal layer traces that may be disposed above the ILD region 134. In aspects, the SDB 112 and the gate-cut isolation structure 114 may intersect the ILD region 134. That is, the SDB 112 and the gate-cut isolation structure 114 may be disposed between portions of the ILD region 134.

FIGS. 3A-6C illustrate example operations for fabricating a semiconductor device having an SDB and a gate-cut isolation structure, in accordance with certain aspects of the present disclosure. FIGS. 3A, 4A, 5A, and 6A illustrate example top views of the fabrication operations, and FIGS. 3B, 4B, 5B, and 6B and FIGS. 3C, 4C, 5C, and 6C illustrate corresponding cross-sectional views along the cross-sections taken across lines A-A and B-B of the operations depicted in FIGS. 3A, 4A, 5A, and 6A, respectively.

In aspects, the operations described herein with respect to FIGS. 3A-6C may be performed by a semiconductor fabrication facility, for example. The operations may also represent a portion of the front-end of line (FEOL) fabrication process of the semiconductor device. Expressed another way, additional steps may be performed before or after the operations described herein to fabricate the semiconductor device. For instance, fin structures may be merged by growing a semiconductor on each fin via an epitaxial growth process.

Figure 3A:
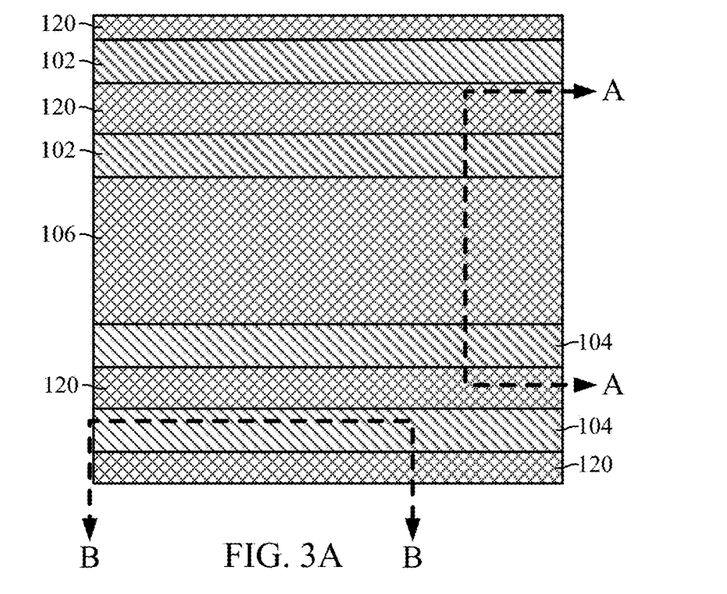
FIG. 3A illustrates a top view of example fin structures formed on a semiconductor wafer, in accordance with certain aspects of the present disclosure.
Figure 3B:
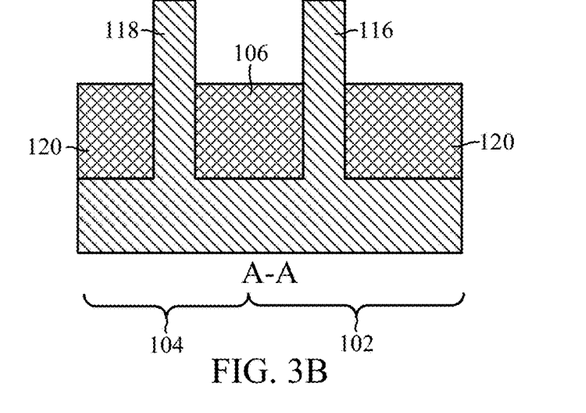
FIG. 3B illustrates a cross-sectional view of the example fin structures of FIG. 3A, in accordance with certain aspects of the present disclosure.
Figure 3C:
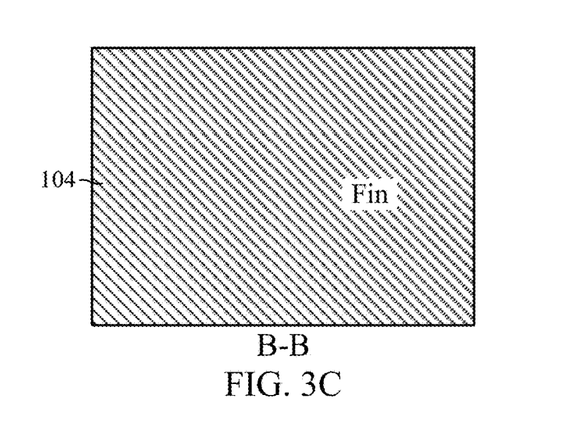
FIG. 3C illustrates another cross-sectional view of the fin structures of FIG. 3A, in accordance with certain aspects of the present disclosure.

As shown in FIGS. 3A-C, active regions of the finFETs (including the semiconductor fins 116, 118) are formed in a semiconductor layer (including the semiconductor regions 102, 104). For instance, a semiconductor layer (e.g., a silicon wafer) may be etched to form a plurality of semiconductor fins including the first and second semiconductor fins 116, 118. That is, trenches may be formed in the semiconductor layer, resulting in parallel, laterally spaced fin structures. The trenches may be formed using an etching process (e.g., dry or wet etching) and/or drilling process (e.g., laser drilling). Patterning masks (e.g., a silicon nitride hard mask formed on above the silicon wafer) may be used to etch the trenches in the semiconductor layer.

A dielectric material may be formed in the trenches. For example, the trenches may be filled with a dielectric material such that the dielectric regions 106, 120 are formed between the fin structures including the first and second semiconductor fins 116, 118. In certain aspects, a portion of the dielectric material may be removed between the fin structures such that at least a portion of the fin structures are exposed. That is, the dielectric material may be etched to recess the dielectric regions 106, 120 between the fin structures (i.e., the height of the dielectric regions 106, 120 is less than the height of the fin structures).

Figure 4A:
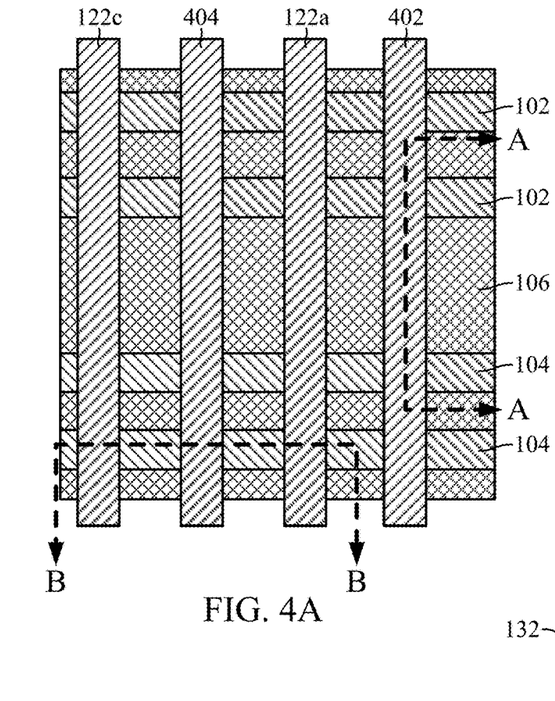
FIG. 4A illustrates a top view of dummy gate regions formed above semiconductor regions, in accordance with certain aspects of the present disclosure.
Figure 4B:
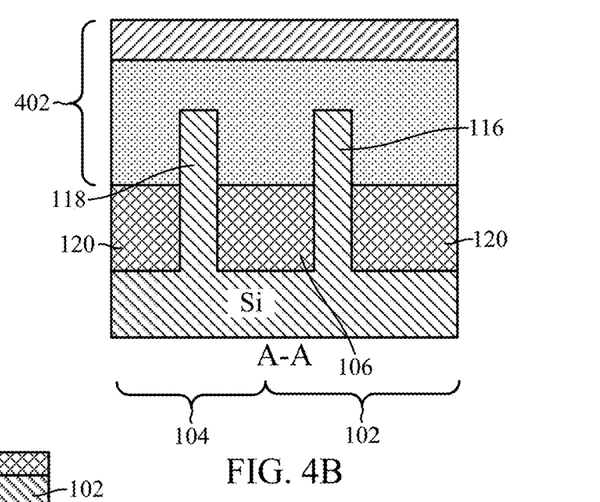
FIG. 4B illustrates a cross-sectional view along one of the dummy gate regions of FIG. 4A, in accordance with certain aspects of the present disclosure.
Figure 4C:
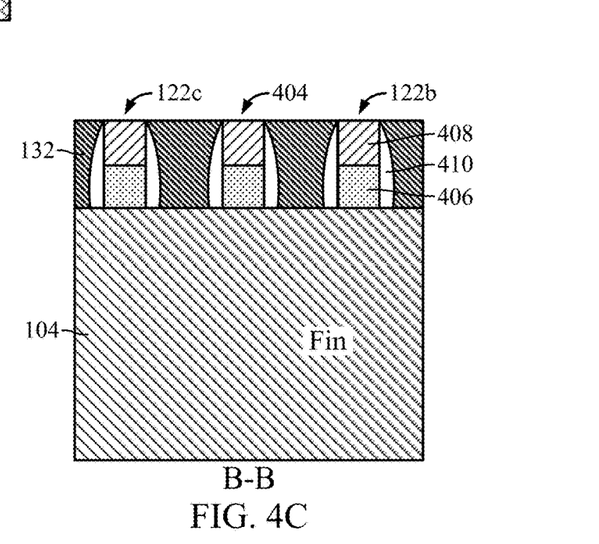
FIG. 4C illustrates a cross-sectional view along one of the semiconductor regions of FIG. 4A, in accordance with certain aspects of the present disclosure.

As illustrated in FIGS. 4A-C, multiple gate regions (including a first gate region 402, a second gate region 404, and the additional gate regions 122) may be formed above the semiconductor regions 102, 104. Each of the gate regions 122, 402, 404 may span a width of the dielectric region 106 between the first and second semiconductor regions 102, 104. In aspects, the gate regions 122, 402, 404 may be dummy gates that facilitate the formation of a mold for the deposition of various work function metals and gate conductors through a replacement metal gate (RMG) process. For instance, a dummy gate may be formed with a polysilicon material 406 (e.g., a polycrystalline silicon material) and silicon nitride cap 408 above the semiconductor regions 102, 104. The dummy gates may be formed in parallel strips. Gate spacers 410 may also be formed above the semiconductor regions 102, 104 and adjacent to lateral surfaces of each of the gate regions 122, 402, 404. The dielectric material 132 may be formed between the gate regions 122, 402, 404 and above the semiconductor regions 102, 104. The top surfaces of the gate regions 122, 402, 404 and dielectric material 132 may be smoothed using a planarization process such as a chemical-mechanical planarization (CMP) process.

Figure 5A:
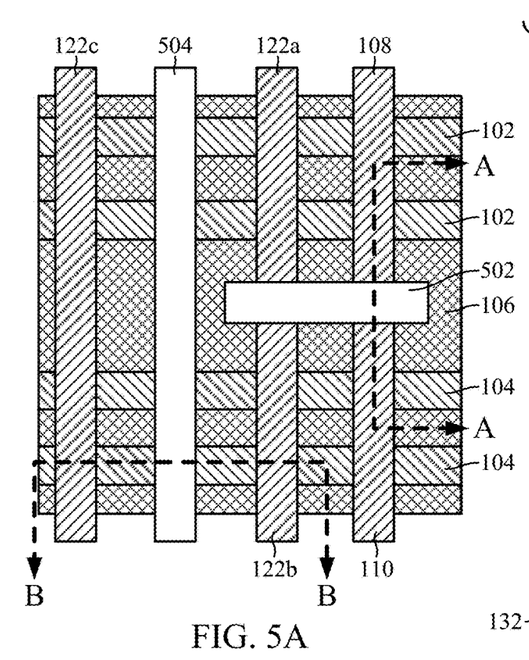
FIG. 5A illustrates a top view of an SDB trench formed along one of the gate regions and a gate-cut trench formed along a dielectric region, in accordance with certain aspects of the present disclosure.
Figure 5B:
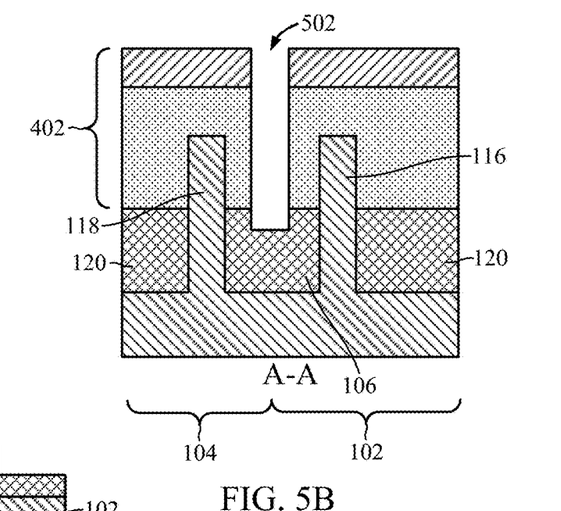
FIG. 5B illustrates a cross-sectional view of the gate-cut trench of FIG. 5A, in accordance with certain aspects of the present disclosure.
Figure 5C:
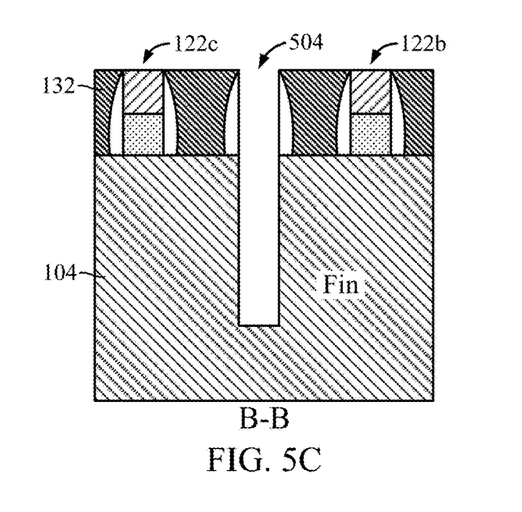
FIG. 5C illustrates a cross-sectional view of the SDB trench of FIG. 5A, in accordance with certain aspects of the present disclosure.

Referring to FIGS. 5A-C, a first trench 502 may be formed to separate portions of the first gate region 402 into a first portion (e.g., the first gate region 108) and a second portion (e.g., the second gate region 110). The first trench 502 may intersect one or more gate regions (e.g., the first gate region 402) and a portion of the dielectric region 106. The first trench 502 may extend longitudinally through the dielectric region 106 to intersect one or more of the gate regions 402, 122a. For instance, the first trench 502 may separate the additional gate region 122a of FIG. 4A into two separate additional gate regions 122a, 122b of FIG. 5A. Also referred to as a gate-cut region, the first trench 502 may serve as a mold for the gate-cut isolation structure 114.

A second trench 504 may be formed laterally spaced from the first gate region 402 such that the second trench 504 removes the dummy gate materials in the second gate region 404. The second trench 504 intersects at least one of the first semiconductor region 102 or second semiconductor region 104. In aspects, the second trench 504 may intersect a width of the dielectric region 106 and serve as a mold for the SDB 112. Thus, the second trench 504 may be referred to as an SDB trench.

In certain aspects, the first and second trenches 502, 504 may be formed using an etching process (e.g., dry or wet etching) and/or drilling process (e.g., laser drilling). Patterning masks may be used to etch the first and second trenches 502, 504 into a gate-cut region (e.g., the first trench 502) and SDB region (e.g., the second trench 504). The etching process for the first trench 502 may include removing portions of the polysilicon material 406 and silicon nitride cap 408 of the first gate region 402. The etching process for the second trench 504 may include removing the polysilicon material 406 and silicon nitride cap 408 of the second gate region 404. Formation of the first and second trenches 502, 504 may occur concurrently during the same processing stage. In some aspects, the first trench 502 may be formed separately from the second trench 504. For instance, in certain cases, the first trench 502 may be formed before the second trench 504, and in other cases, the first trench 502 may be formed after the second trench 504. In other aspects, the first trench 502 may be formed simultaneously with the second trench 504.

Figure 6A:
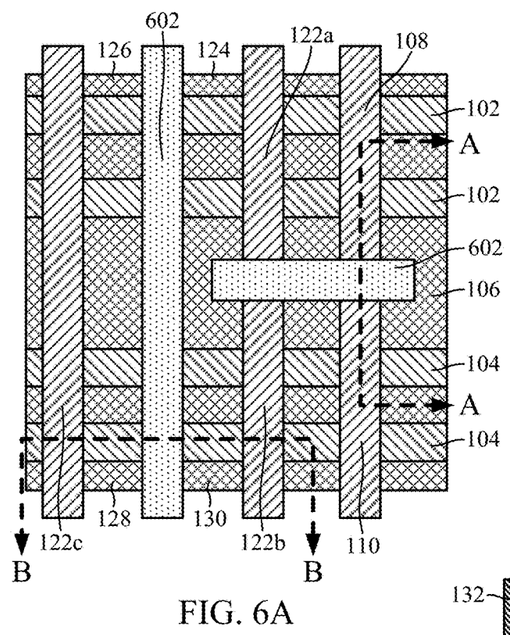
FIG. 6A illustrates a top view of filling the SDB and gate-cut trenches with the same insulation material, in accordance with certain aspects of the present disclosure.
Figure 6B:
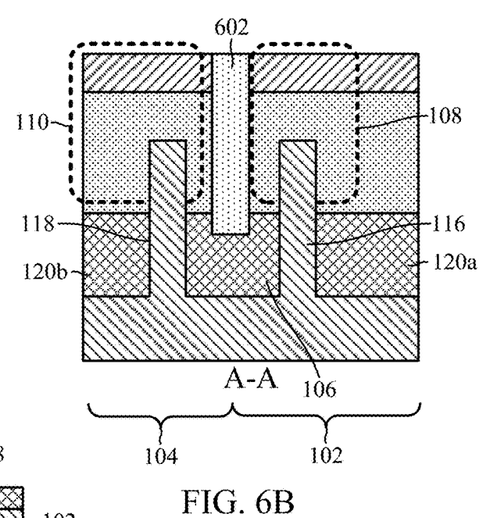
FIG. 6B illustrates a cross-sectional view of the gate-cut trench filled with the insulation material of FIG. 6A, in accordance with certain aspects of the present disclosure.
Figure 6C:
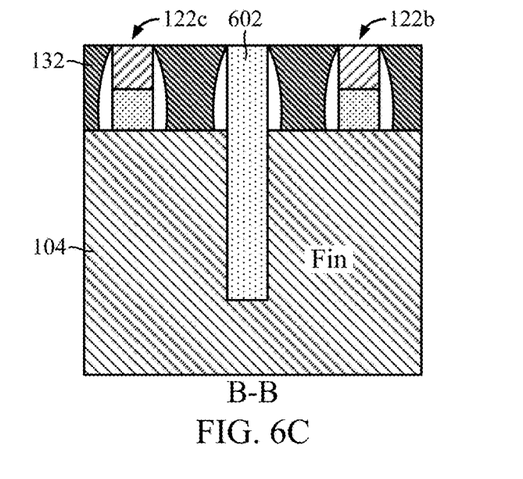
FIG. 6C illustrates a cross-sectional view of the SDB trench filled with the insulation material of FIG. 6A, in accordance with certain aspects of the present disclosure.

As illustrated in FIGS. 6A-C, the first and second trenches 502, 504 may be at least partially filled with the same insulation material 602 (e.g., silicon dioxide, silicon nitride, or a dielectric material having a low dielectric constant (κ) relative to silicon dioxide) to form the SDB (e.g., the SDB 112) and the gate-cut isolation structure (e.g., the gate-cut isolation structure 114). For example, the insulation material 602 may be deposited in the first and second trenches 502, 504 using a chemical vapor deposition (e.g., chemical vapor evaporation) process and/or a spin-on coating process. In certain aspects, the first and second trenches 502, 504 may be partially filled with a silicon nitride liner and then filled with a spin-on dielectric such as silicon dioxide. Filling the first and second trenches 502, 504 with the same insulation material 602 may occur concurrently during the same processing stage. One trench may be filled before the other, or the two trenches may be filled simultaneously. After filling the first and second trenches 502, 504 with the insulation material 602, the top surface of the gate regions 122, the dielectric material 132, and the insulation material 602 may be smoothed using a planarization process such as a chemical mechanical planarization process.

In certain aspects, an ILD region (e.g., the ILD region 134) may be formed above the gate regions before the SDB and gate-cut isolation structure are formed. In such a case, after the ILD region is formed above the gate regions, the first and second trenches 502, 504 may be formed to intersect the ILD region, and then the first and second trenches 502, 504 may be concurrently filled with the same insulation material 602 as described herein with respect to FIGS. 5A-C and 6A-C.

Figure 7:
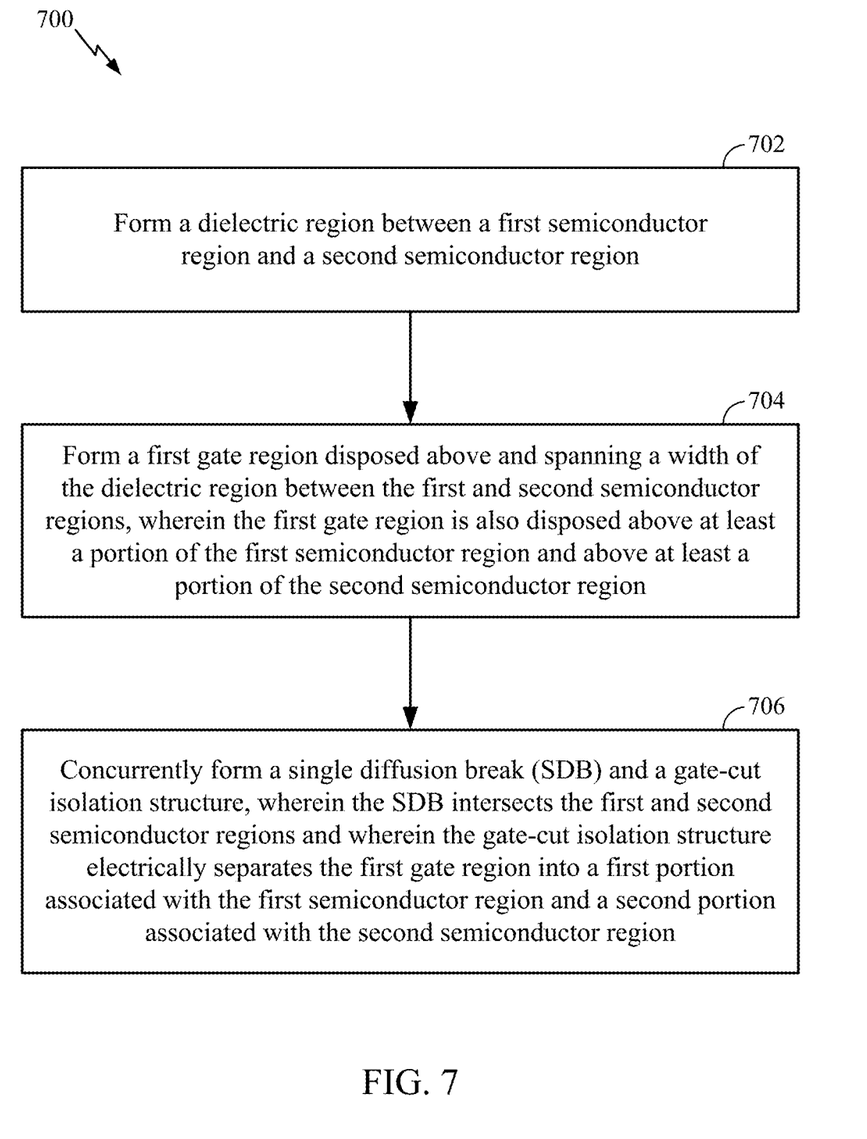
FIG. 7 is a flow diagram of example operations for fabricating a semiconductor device, in accordance with certain aspects of the present disclosure.

FIG. 7 is a flow diagram of example operations 700 for fabricating a semiconductor device having an SDB and a gate-cut isolation structure, in accordance with certain aspects of the present disclosure. The operations 700 may be performed by a semiconductor fabrication facility, for example.

The operations 700 begin, at block 702, by forming a dielectric region (e.g., the dielectric region 106) between a first semiconductor region (e.g., the first semiconductor region 102) and a second semiconductor region (e.g., the second semiconductor region 104). At block 704, a first gate region (e.g., the first gate region 402) may be formed above and spanning a width of the dielectric region between the first and second semiconductor regions. The first gate region is also disposed above at least a portion of the first semiconductor region (e.g., the first semiconductor fin 116) and above at least a portion of the second semiconductor region (e.g., the second semiconductor fin 118). At block 706, an SDB (e.g., the SDB 112) and a gate-cut isolation structure (e.g., the gate-cut isolation structure 114) are concurrently formed. The SDB intersects the first and second semiconductor regions, and the gate-cut isolation structure electrically separates the first gate region into a first portion (e.g., the first gate region 108) associated with the first semiconductor region and a second portion (e.g., the second gate region 110) associated with the second semiconductor region.

According to certain aspects, concurrently forming the SDB and the gate-cut isolation structure may include forming trenches (e.g., first and second trenches 502, 504) for the SDB and gate-cut isolation structure simultaneously or separately and then simultaneously or sequentially filling the trenches with the same insulation material (e.g., the insulation material 602). For example, with respect to operations 700, concurrently forming the SDB and the gate-cut isolation structure at block 706 may include forming an SDB trench (e.g., the second trench 504) laterally spaced from the first gate region, forming a gate-cut region (e.g., the first trench 502) through the first gate region to separate the first gate region into the first portion and the second portion, and filling in at least a portion of the SDB trench and at least a portion of the gate-cut region, with the same insulation material. In certain aspects, forming the SDB trench and gate-cut region may include removing a portion of an ILD region (e.g., the ILD region 134) disposed above the gate regions.

The dielectric region between the first semiconductor region and the second semiconductor region may include a dielectric material, such as silicon dioxide. The dielectric region may include a shallow trench isolation (STI) region that electrically isolates the semiconductor regions 102, 104 from each other.

In aspects, the operations 700 may fabricate a semiconductor device with finFETs. As an example, the operations 700 may include forming the first and second semiconductor regions as semiconductor fins, for example, as described herein with respect to FIGS. 3A-3C.

In aspects, forming the first gate region (e.g., the first gate region 402) at block 704 may include forming a dummy gate, which may include forming a strip of polycrystalline silicon (e.g., the polysilicon material 406) around the semiconductor fins of the first and second semiconductor regions and forming a hard mask gate cap (e.g., the silicon nitride cap 408) above the strip of polycrystalline silicon. After forming the dummy gate, gate spacers (e.g., the gate spacers 410) may be formed adjacent to the strip of polycrystalline silicon and gate cap, for example, as depicted in FIG. 4C. A dielectric material (e.g., the dielectric material 132) may be deposited adjacent to the semiconductor fins and the gate spacers. The top surface of the dielectric material may be smoothed (e.g., planarized via a chemical-mechanical planarization process) to expose the polycrystalline silicon. The polycrystalline silicon may be removed (e.g., via an etching process) such that a trench for the first gate region is formed in the dielectric material, and work function metal layers and gate conductors may be deposited in the trench.

In aspects, multiple gate regions may be formed in parallel strips and laterally spaced from each other above the semiconductor regions. For example, the operations 700 may include forming a second gate region (e.g., the second gate region 404 and/or the additional gate regions 122) laterally spaced from the first gate region and disposed above and spanning the width of the dielectric region between the first and second semiconductor regions. The second gate region may also be disposed above at least another portion of the first semiconductor region and above at least another portion of the second semiconductor region.

In certain aspects, the gate-cut isolation structure may electrically separate multiple pairs of gate regions. For example, when forming the gate-cut isolation structure at block 706, the gate-cut isolation structure may also separate the second gate region into a first portion associated with the first semiconductor region and a second portion associated with the second semiconductor region. Expressed another way, concurrently forming the SDB and the gate-cut isolation structure at block 706 may include forming an SDB trench laterally spaced from the first and second gate regions and forming a gate-cut region (e.g., the first trench 502) through the first and second gate regions between the first semiconductor region and the second semiconductor region. The SDB trench and gate-cut region may be filled with the same insulation material.

In aspects, the SDB trench may intersect multiple fin structures. With respect to the operations 700, the SDB trench may intersect at least an additional portion (e.g., an additional fin structure) of the first semiconductor region and at least an additional portion (e.g., an additional fin structure) of the second semiconductor region, for example, as depicted in FIG. 5A.

In aspects, the gate-cut region intersects a portion of the dielectric region and is angled with respect to the SDB trench. For example, the gate-cut region may be angled perpendicular to the SDB trench or angled at an oblique angle to the SDB trench.

In aspects, forming the SDB trench and/or forming the gate-cut region may include performing an etching process based on a mask.

In aspects, the gate-cut isolation structure and the SDB may be formed after a dielectric layer (e.g., an interlayer dielectric) is formed above the gate regions. For example, the operations 700 may further include forming a dielectric material (e.g., the ILD region 134) above the first and second gate regions. The SDB trench and the gate-cut region are formed after forming the first and second gate regions and after forming the dielectric material. The SDB trench and the gate-cut region may intersect the dielectric material, for example, as depicted in FIGS. 2A and 2B.

In other aspects, the gate-cut isolation structure and the SDB may be formed before a dielectric layer (e.g., an interlayer dielectric) is formed above the gate regions. For example, the operations 700 may further include forming a dielectric material (e.g., the ILD region 134) above the first and second gate regions, wherein the SDB trench and the gate-cut region are formed after forming the first and second gate regions, but before forming the dielectric material.

In certain aspects, the insulation material may include silicon dioxide, silicon nitride, or a dielectric material having a low dielectric constant relative to silicon dioxide. In aspects, the insulation material in the at least the portion of the SDB trench electrically separates a first portion (e.g., the first portion 124) of the first semiconductor region from a second portion (e.g., the second portion 126) of the first semiconductor region, electrically separates a first portion (e.g., the first portion 128) of the second semiconductor region from a second portion (e.g., the second portion 130) of the second semiconductor region, and forms the SDB. The insulation material in the at least the portion of the gate-cut region electrically separates the first portion (e.g., the first gate region 108) of the first gate region from the second portion (e.g., the second gate region 110) of the first gate region, electrically separates the first portion of the second gate region from the second portion of the second gate region, and forms the gate-cut isolation structure.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. A method of fabricating a semiconductor device, comprising:

forming a dielectric region between a first semiconductor region and a second semiconductor region;

forming a first gate region disposed above and spanning a width of the dielectric region between the first and second semiconductor regions, wherein the first gate region is also disposed above at least a portion of the first semiconductor region and above at least a portion of the second semiconductor region; and concurrently forming a single diffusion break (SDB) and a gate-cut isolation structure, wherein:
the SDB intersects the first and second semiconductor regions;
the gate-cut isolation structure electrically separates the first gate region into a first portion associated with the first semiconductor region and a second portion associated with the second semiconductor region; and
the gate-cut isolation structure intersects a portion of the dielectric region and is angled with respect to the SDB.

2. The method of claim 1, further comprising forming the first and second semiconductor regions as semiconductor fins, wherein forming the first gate region comprises:
forming a strip of polycrystalline silicon around the semiconductor fins of the first and second semiconductor regions;
forming gate spacers adjacent to the strip of polycrystalline silicon;
depositing a dielectric material adjacent to the semiconductor fins and the gate spacers;
planarizing the dielectric material to expose the polycrystalline silicon;
removing the polycrystalline silicon such that a trench for the first gate region is formed in the dielectric material; and
depositing work function metal layers and gate conductors in the trench.

3. The method of claim 2, wherein concurrently forming the SDB and the gate-cut isolation structure comprises:
forming an SDB trench laterally spaced from the first gate region;
forming a gate-cut region through the first gate region to separate the first gate region into the first portion and the second portion; and
filling in at least a portion of the SDB trench and at least a portion of the gate-cut region, with a same insulation material.

4. The method of claim 3, wherein the same insulation material comprises silicon dioxide, silicon nitride, or a dielectric material having a low dielectric constant relative to silicon dioxide.

5. The method of claim 3, wherein the at least the portion of the SDB trench and the at least the portion of the gate-cut region are filled in simultaneously.

6. The method of claim 3, wherein the SDB trench and the gate-cut region are formed simultaneously.

7. The method of claim 2, further comprising:
forming a second gate region laterally spaced from the first gate region and disposed above and spanning the width of the dielectric region between the first and second semiconductor regions, wherein:
the second gate region is also disposed above at least another portion of the first semiconductor region and above at least another portion of the second semiconductor region; and
the gate-cut isolation structure separates the second gate region into a first portion associated with the first semiconductor region and a second portion associated with the second semiconductor region.

8. The method of claim 7, wherein concurrently forming the SDB and the gate-cut isolation structure comprises:
forming an SDB trench laterally spaced from the first and second gate regions;
forming a gate-cut region through the first and second gate regions between the first semiconductor region and the second semiconductor region; and
filling in at least a portion of the SDB trench and at least a portion of the gate-cut region with a same insulation material to form the SDB and the gate-cut isolation structure, respectively.

9. The method of claim 8, wherein the insulation material in the at least the portion of the SDB trench electrically separates a first portion of the first semiconductor region from a second portion of the first semiconductor region, electrically separates a first portion of the second semiconductor region from a second portion of the second semiconductor region, and forms the SDB.

10. The method of claim 8, wherein the insulation material in the at least the portion of the gate-cut region electrically separates the first portion of the first gate region from the second portion of the first gate region, electrically separates the first portion of the second gate region from the second portion of the second gate region, and forms the gate-cut isolation structure.

11. The method of claim 8, further comprising forming a dielectric material above the first and second gate regions, wherein the SDB trench and the gate-cut region are formed after forming the first and second gate regions and after forming the dielectric material, wherein the SDB trench and the gate-cut region intersect the dielectric material.

12. The method of claim 8, further comprising forming a dielectric material above the first and second gate regions, wherein the SDB trench and the gate-cut region are formed after forming the first and second gate regions, but before forming the dielectric material.

13. The method of claim 8, wherein the SDB trench intersects at least an additional portion of the first semiconductor region and at least an additional portion of the second semiconductor region.

14. The method of claim 8, wherein the gate-cut region intersects the portion of the dielectric region and is angled with respect to the SDB trench.

15. A semiconductor device, comprising:
a first semiconductor region;
a second semiconductor region;
a dielectric region disposed between the first semiconductor region and the second semiconductor region;
a first gate region disposed above a portion of the first semiconductor region; a second gate region disposed above a portion of the second semiconductor region;
a single diffusion break (SDB), comprising an insulation material, intersecting at least one of the first semiconductor region or the second semiconductor region and laterally spaced from the first and second gate regions; and
a gate-cut isolation structure comprising the same insulation material as the SDB and disposed between and electrically separating the first gate region and the second gate region, wherein the gate-cut isolation structure intersects a portion of the dielectric region and is angled with respect to the SDB.

16. The semiconductor device of claim 15, further comprising:
a third gate region disposed above an additional portion of the first semiconductor region; and
a fourth gate region disposed above an additional portion of the second semiconductor region, wherein the gate-cut isolation structure is disposed between and electrically separates the third gate region and the fourth gate region.

17. The semiconductor device of claim 15, wherein:
the portion of the first semiconductor region comprises a first semiconductor fin;
the portion of the second semiconductor region comprises a second semiconductor fin;
the first gate region is disposed around the first semiconductor fin; and
the second gate region is disposed around the second semiconductor fin.

18. The semiconductor device of claim 15, wherein the same insulation material comprises silicon dioxide, silicon nitride, or a dielectric material having a low dielectric constant relative to silicon dioxide.

19. The semiconductor device of claim 15, wherein the SDB electrically separates other portions of the first and second semiconductor regions.

\* \* \* \* \*